US012366593B2

(12) United States Patent
Cui et al.

(10) Patent No.: US 12,366,593 B2
(45) Date of Patent: Jul. 22, 2025

(54) SPIN HALL DEVICE, METHOD FOR OBTAINING HALL VOLTAGE, AND MAX POOLING METHOD

(71) Applicant: INSTITUTE OF MICROELECTRONICS, CHINESE ACADEMY OF SCIENCES, Beijing (CN)

(72) Inventors: Yan Cui, Beijing (CN); Jun Luo, Beijing (CN); Meiyin Yang, Beijing (CN); Jing Xu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 438 days.

(21) Appl. No.: 17/942,246

(22) Filed: Sep. 12, 2022

(65) Prior Publication Data

US 2023/0125211 A1 Apr. 27, 2023

(30) Foreign Application Priority Data

Oct. 27, 2021 (CN) .......................... 202111258291.0

(51) Int. Cl.
| | |
|---|---|
| *G01R 15/20* | (2006.01) |
| *G01R 19/25* | (2006.01) |
| *G01R 19/30* | (2006.01) |
| *G01R 33/07* | (2006.01) |
| *G01R 33/09* | (2006.01) |
| *G06N 3/0464* | (2023.01) |
| *G06N 3/065* | (2023.01) |

(52) U.S. Cl.
CPC ........... *G01R 15/202* (2013.01); *G01R 19/25* (2013.01); *G01R 19/30* (2013.01); *G01R 33/07* (2013.01); *G01R 33/093* (2013.01); *G06N 3/065* (2023.01); *G06N 3/0464* (2023.01)

(58) Field of Classification Search
CPC ...... G01R 15/202; G01R 19/25; G01R 33/07; G01R 33/093; G01R 19/30; G06N 3/065; G06N 3/0464
USPC ......................................................... 324/126
See application file for complete search history.

(56) References Cited

U.S. PATENT DOCUMENTS

| | | | | |
|---|---|---|---|---|
| 2009/0161265 | A1* | 6/2009 | Sugano | G01R 33/1284 360/324 |
| 2017/0163182 | A1* | 6/2017 | Fedigan | G01R 33/077 |
| 2017/0272011 | A1* | 9/2017 | Fedigan | H02P 21/06 |
| 2018/0358543 | A1* | 12/2018 | Le | G01R 33/07 |
| 2019/0079147 | A1* | 3/2019 | Rhie | G01R 33/09 |

(Continued)

*Primary Examiner* — Raul J Rios Russo
(74) *Attorney, Agent, or Firm* — Scully, Scott, Murphy & Presser, P.C.

(57) ABSTRACT

The present application discloses a spin Hall device, a method for obtaining a Hall voltage, and a max pooling method. The spin Hall device includes a cobalt ferroboron layer. A top view and a bottom view of the spin Hall device are completely the same as a cross-shaped graph that has two axes of symmetry perpendicular to each other and equally divided by each other. The spin Hall device of the present application has non-volatility and analog polymorphic characteristics, can be used for obtaining a Hall voltage and applied to various circuits, is simple in structure and small in size, can save on-chip resources, and can meet computation requirements.

12 Claims, 2 Drawing Sheets

(56) References Cited

U.S. PATENT DOCUMENTS

2019/0317175 A1* 10/2019 Polley ............... G01R 33/0035
2021/0119117 A1*  4/2021 Kim ...................... H10N 50/85

* cited by examiner

SPIN HALL DEVICE, METHOD FOR OBTAINING HALL VOLTAGE, AND MAX POOLING METHOD

TECHNICAL FIELD

The present application relates to the technical field of electronic components, and in particular to a spin Hall device, a method for obtaining a Hall voltage, and a max pooling method.

BACKGROUND ART

With the advent of an artificial intelligence era, image recognition is more and more widely used in edge terminals. A convolutional neural network (CNN) is the most widely used deep neural network in image recognition. Mathematical operations performed by each layer of network include: convolution, i.e. multiply-summate; nonlinear activation; and max pooling. In the case of large input digital bits of a traditional digital comparator, the scale of circuit will be increased rapidly, large on-chip resources are occupied, and it is very unfavorable for the development of multi-functional on-chip integration of artificial intelligence chips. It is an urgent technical problem to implement an electronic component which has a simple structure, occupies less on-chip resources in a circuit and meets the computation requirements.

SUMMARY OF THE INVENTION

It is an object of the present application to provide a spin Hall device, a method for obtaining a Hall voltage, and a max pooling method. The following presents a simplified summary in order to provide a basic understanding of some aspects of the disclosed embodiments. This summary section is not an extensive overview and is intended to neither identify key/critical components nor delineate the protection scope of such embodiments. The sole purpose is to present some concepts in a simplified form as a prelude to the more detailed description that is presented later.

According to a first aspect of embodiments of the present application, a spin Hall device is provided. The spin Hall device includes a cobalt ferroboron layer. A top view and a bottom view of the spin Hall device are completely the same as a cross-shaped graph that has two axes of symmetry perpendicular to each other and equally divided by each other.

In some embodiments of the present application, the spin Hall device includes a substrate layer, a tungsten layer, the cobalt ferroboron layer, a magnesium oxide layer, a tantalum layer, and a ruthenium layer, which are stacked from bottom to top in sequence.

In some embodiments of the present application, the tungsten layer has a thickness of 2-5 nm; the cobalt ferroboron layer has a thickness of 1-1.5 nm; the magnesium oxide layer has a thickness of 1.5-2.5 nm; and the tantalum layer and the ruthenium layer have a total thickness of 1-10 nm.

According to a second aspect of embodiments of the present application, a method for obtaining a Hall voltage is provided. The method is implemented by the spin Hall device as described in any of the foregoing. The two axes of symmetry are a first axis of symmetry and a second axis of symmetry. The method includes:

applying at least one drive current to one end of the first axis of symmetry, wherein the drive current is greater than an initial drive current and less than a saturated drive current, the initial drive current is a current when the Hall voltage of the spin Hall device starts to change, and the saturated drive current is a current when the Hall voltage of the spin Hall device is saturated; and reading the at least one drive current with the same read current, and obtaining a Hall voltage across the second axis of symmetry until all the drive currents are read out to obtain a Hall voltage corresponding to a max drive current in the at least one drive current.

According to a third aspect of embodiments of the present application, a method for max pooling of multiple input data is provided. The method includes:

converting the input data into a drive current; and executing the method for obtaining a Hall voltage as described above, wherein the Hall voltage corresponding to the max drive current corresponds to max data among the multiple input data, and the max data is the result of max pooling.

According to a fourth aspect of embodiments of the present application, a device for max pooling of multiple input data is provided. The device includes a digital-to-analog converter and the spin Hall device as described in any of the foregoing.

The digital-to-analog converter is configured to convert the input data into a drive current.

The spin Hall device is configured to execute the method for obtaining a Hall voltage described in the second aspect. The Hall voltage corresponding to the max drive current corresponds to max data among the multiple input data, and the max data is the result of max pooling.

According to a fifth aspect of embodiments of the present application, a system for max pooling of multiple input data is provided. The system includes the spin Hall device as described in any of the foregoing, a microprocessor, and a random access memory, a digital-to-analog converter and an analog-to-digital converter respectively connected to the microprocessor. The random access memory, the digital-to-analog converter, the spin Hall device, the analog-to-digital converter, and the microprocessor are connected in sequence.

The microprocessor is configured to control the digital-to-analog converter and the analog-to-digital converter.

The digital-to-analog converter is configured to convert the input data into an analog current.

The spin Hall device is configured to receive the analog current, and obtain a Hall voltage corresponding to a max current in the analog current.

The analog-to-digital converter is configured to convert the Hall voltage corresponding to the max current into a digital quantity.

The microprocessor is further configured to receive the digital quantity.

In some embodiments of the present application, the obtaining a Hall voltage corresponding to a max current in the analog current is implemented by the method described in the second aspect. The analog current is used as the drive current.

In some embodiments of the present application, the system further includes an operational amplifier and a filter. The spin Hall device, the operational amplifier, the filter, and the analog-to-digital converter are connected in sequence.

The spin Hall device is configured to receive the analog current, and obtain a Hall voltage corresponding to a max current in the analog current.

The operational amplifier is configured to amplify the Hall voltage corresponding to the max current to obtain an amplified Hall voltage.

The filter is configured to filter the amplified Hall voltage to obtain a filtered Hall voltage.

The analog-to-digital converter is configured to convert the filtered Hall voltage into a digital quantity.

In some embodiments of the present application, the system further includes a random access memory respectively connected to the microprocessor and the digital-to-analog converter.

The microprocessor is further configured to control the random access memory.

The random access memory is configured to receive and store the input data.

According to another aspect of embodiments of the present application, an analog computation neural network acceleration system is provided. The system includes a 1T1R crossbar array, a spin Hall device, an analog-to-digital converter, and a microprocessor. The spin Hall device is the spin Hall device as described in any of the foregoing.

The 1T1R crossbar array is configured to multiply and accumulate convolution computations by Kirchhoff's law under the control of the microprocessor to obtain multiply-accumulate data.

The spin Hall device is configured to process the multiply-accumulate data to obtain a Hall voltage.

The analog-to-digital converter is configured to convert the Hall voltage into a digital signal under the control of the microprocessor.

The microprocessor is configured to receive the digital signal.

In some embodiments of the present application, the analog computation neural network acceleration system further includes a power amplifier, an operational amplifier, a filter, and a low dropout linear regulator. The 1T1R crossbar array, the power amplifier, the spin Hall device, the operational amplifier, the filter, the analog-to-digital converter, and the microprocessor are connected in sequence.

The power amplifier is configured to amplify an electrical signal of the multiply-accumulate data to obtain an amplified electrical signal.

The spin Hall device is configured to process the amplified electrical signal to obtain a Hall voltage.

The operational amplifier is configured to amplify the Hall voltage to obtain an amplified Hall voltage.

The filter is configured to filter the amplified Hall voltage to obtain a filtered Hall voltage.

The analog-to-digital converter is configured to convert the filtered Hall voltage into a digital signal under the control of the microprocessor.

According to another aspect of embodiments of the present application, an analog computation neural network acceleration method is provided. The method is implemented by the analog computation neural network acceleration system as described above.

The analog computation neural network acceleration method includes:

multiplying and accumulating, by the 1T1R crossbar array, convolution computations by Kirchhoff's law under the control of the microprocessor to obtain multiply-accumulate data;

processing, by the spin Hall device, the multiply-accumulate data to obtain a Hall voltage;

converting, by the analog-to-digital converter, the Hall voltage into a digital signal under the control of the microprocessor; and receiving, by the microprocessor, the digital signal.

According to another aspect of embodiments of the present application, an analog computation neural network acceleration method is provided. The method is implemented by the analog computation neural network acceleration system as described above.

The analog computation neural network acceleration method includes:

multiplying and accumulating, by the 1T1R crossbar array, convolution computations by Kirchhoff's law under the control of the microprocessor to obtain multiply-accumulate data;

amplifying, by the power amplifier, an electrical signal of the multiply-accumulate data to obtain an amplified electrical signal;

processing, by the spin Hall device, the amplified electrical signal to obtain a Hall voltage;

amplifying, by the operational amplifier, the Hall voltage to obtain an amplified Hall voltage;

filtering, by the filter, the amplified Hall voltage to obtain a filtered Hall voltage;

converting, by the analog-to-digital converter, the filtered Hall voltage into a digital signal under the control of the microprocessor; and receiving, by the microprocessor, the digital signal.

The spin Hall device provided in one aspect of embodiments of the present application has non-volatility and analog polymorphic characteristics, can be used for obtaining a Hall voltage and applied to various circuits, is simple in structure and small in size, occupies less resources in a circuit, can save on-chip resources, and can meet computation requirements.

Another aspect of embodiments of the present application provides a device for max pooling of multiple input data, including the spin Hall device provided in the first aspect. A max pooling function can be realized by a single device, thereby saving on-chip resources to a great extent, achieving high computation accuracy, and overcoming the defects of the prior art in which a max pooling circuit has a complicated circuit structure and occupies many on-chip resources.

Other features and advantages of the present application will be set forth in the description which follows, and will be obvious from the description partially, or some of the features and advantages may be inferred or unambiguously determined from the description, or may be learned by practicing the embodiments of the present application. The objects and other advantages of the present application may be realized and obtained by the structure particularly pointed out in the written description and claims hereof as well as the appended drawings.

BRIEF DESCRIPTION OF THE DRAWINGS

In order to more clearly illustrate the technical solutions in the embodiments of the present application or the prior art, the drawings needing to be used in the description of the embodiments or the prior art will be briefly introduced below. It is obvious that the drawings in the following description are merely some embodiments in the present application. Those ordinarily skilled in the art may also obtain other drawings according to these drawings without involving any inventive effort.

DETAILED DESCRIPTION OF THE INVENTION

In order that the objects, technical solutions and advantages of the present application will be more clearly understood, the present application will be further described in detail hereinafter with reference to the accompanying drawings and specific embodiments. It should be understood that specific embodiments described herein are merely illustrative of the present application and are not intended to be limiting thereof. All other embodiments obtained by those ordinarily skilled in the art based on the embodiments in the present application without involving creative efforts fall within the scope of protection of the present application.

It will be understood by those skilled in the art that, unless otherwise defined, all terms (including technical and scientific terms) used herein have the same meaning as commonly understood by those ordinarily skilled in the art to which the present application belongs. It should be further understood that terms, such as those defined in general dictionaries, should be interpreted as having a meaning that is consistent with the meaning in the context of the prior art and will not be interpreted in an idealized or overly formal sense unless expressly so defined herein.

Figure 1:
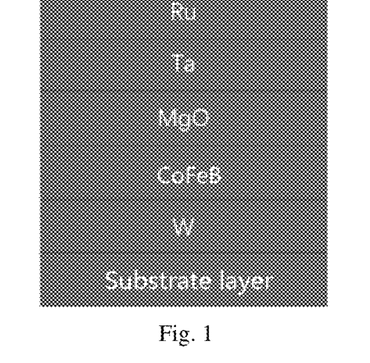
FIG. 1 shows a film structure diagram of a spin Hall device according to a first embodiment.

A first embodiment of the present application provides a spin Hall device, in particular a SOT-type spin Hall device. A film structure of the SOT-type spin Hall device is as shown in FIG. 1, including a substrate layer, a tungsten layer (W), a cobalt ferroboron layer (CoFeB), a magnesium oxide layer (MgO), a tantalum layer (Ta), and a ruthenium layer (Ru) which are stacked from bottom to top in sequence. The thickness of the tungsten layer is 2-5 nm so as to provide a strong spin Hall effect. The thickness of the cobalt ferroboron layer is 1-1.5 nm so as to ensure that it has a certain vertical magnetic anisotropy, so that the device may generate an abnormal Hall effect. The thickness of the magnesium oxide layer is controlled to be about 2 nm (for example, 1.5-2.5 nm) as a covering layer to enhance the vertical magnetic anisotropy of the cobalt ferroboron layer. The total thickness of the tantalum layer and the ruthenium layer is controlled to be within 10 nm (for example, 1-10 nm), and the layers are used as a protective layer to protect the SOT-type spin Hall device (if the total thickness of the tantalum layer and the ruthenium layer is too large, a short circuit may occur during operation, thereby inhibiting the occurrence of an abnormal Hall effect).

Figure 2:
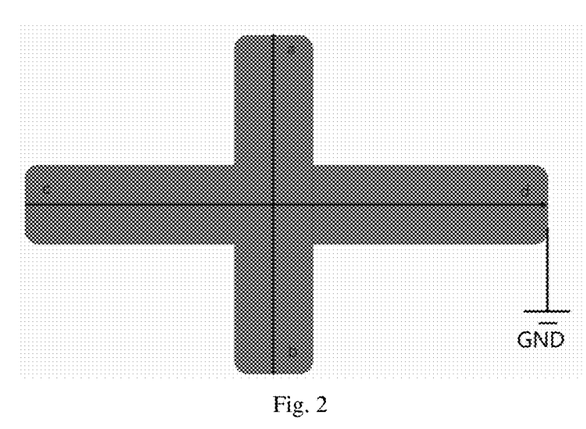
FIG. 2 shows a top view of a spin Hall device according to a first embodiment.

As shown in FIG. 2, the shape and size of a top view and a bottom view of the SOT-type spin Hall device are completely the same, and both the top view and the bottom view are a cross-shaped graph that is both an axisymmetric graph (there are two axes of symmetry) and a centrosymmetric graph. The cross-shaped graph has a first axis of symmetry cd and a second axis of symmetry ab, which are perpendicular to each other and equally divided by each other. The length of cd is greater than that of ab.

The spin Hall device of this embodiment has non-volatility and analog polymorphic characteristics, can be used for obtaining a Hall voltage and applied to various circuits, is simple in structure and small in size, can save on-chip resources, and can meet computation requirements. In specific application, a max pooling function can be realized by only one spin Hall device of this embodiment, thereby greatly saving the overhead of on-chip resources. The max pooling function of the spin Hall device is realized by a serial mode, which can fully meet the computational requirements of a convolutional neural network and is very suitable for constructing the convolutional neural network.

Figure 3:
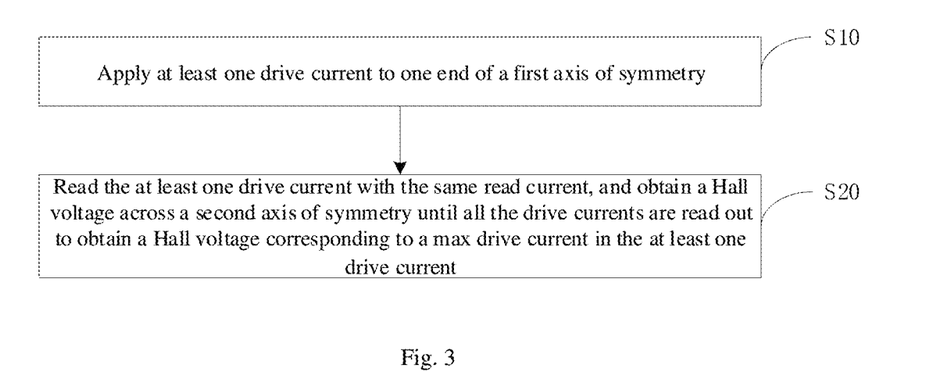
FIG. 3 shows a flowchart of a method for obtaining a Hall voltage according to another embodiment.

A second embodiment of the present application provides a method for obtaining a Hall voltage. The method is implemented by the spin Hall device in any of the foregoing implementations. With reference to FIG. 3, the method may include the following steps.

At S10, at least one drive current is applied to one end of a first axis of symmetry.

The drive current is greater than an initial drive current and less than a saturated drive current. The initial drive current is a current when the Hall voltage of the spin Hall device starts to change. The saturated drive current is a current when the Hall voltage of the spin Hall device is saturated.

At S20, the at least one drive current is read with the same read current, and a Hall voltage across a second axis of symmetry is obtained until all the drive currents are read out to obtain a Hall voltage corresponding to a max drive current in the at least one drive current.

Specifically, when a current passes across the first axis of symmetry cd of the SOT-type spin Hall device, a potential difference Vab is generated between both ends of the second axis of symmetry ab on the SOT-type spin Hall device. The magnitude of the potential difference Vab is related to the magnitude of a passing current I and intrinsic properties of a magnetic material. The potential difference satisfies: Vab=K(I)*I, where K(I) is referred to as an abnormal Hall resistance.

Based on the fact that the Hall voltage of the spin Hall device has the form Vab=K(I)*I, it is possible to change K(I) with a pulsed drive current of varying intensity and read the Hall voltage of the device with a pulsed current of constant intensity in practical application.

For example, a drive current having a pulse width of 10 ms and a current intensity of −10 mA to 10 mA is used. After each pulsed drive current is finished, a pulse current having a pulse width of 10 ms and a fixed intensity of 1 mA is provided, and the Hall voltage at this moment is read. A timing control of the current is as shown in the middle figure above, and an output curve of the device is as shown in the right figure above and illustrated by a negative current (the current flows from d to c). It can be seen that when the drive current is within a range of −4 mA to −8 mA, the Hall voltage changes. Meanwhile, from a hysteresis curve in this range, the device shows analog polymorphic characteristics and non-volatility.

In addition, the following information may also be obtained from the output curve: K(Id) has non-volatility. That is, when the drive current is within the range of −4 mA to −8 mA, the current induces a single K(Id), and after the drive current disappears, the Hall voltage may be read by using an external read current action of the drive current range. Therefore, the Hall voltage of the device may be expressed as Vab=K(Id)*Ir, where Id is the drive current and Ir is the read current.

The method for obtaining a Hall voltage in the second embodiment obtains the Hall voltage by the spin Hall device in the first embodiment, is simple in operation, and can accurately obtain the Hall voltage.

A third embodiment of the present application proposes a method for max pooling of multiple input data. The method may include the following steps.

At S00, the input data is converted into a drive current.

The input data may be converted into a drive current by a digital-to-analog converter. Specifically, the digital-to-analog converter converts the input data into an analog current, which is used as a drive current.

The method for obtaining a Hall voltage in any of the foregoing implementations is executed. The Hall voltage corresponding to the max drive current corresponds to max data among the foregoing plurality of input data, and the max data is the result of max pooling.

In one example, it is assumed that the drive current to start changing the Hall voltage is Ic and the drive current to saturate the Hall voltage is Is. Here, Ic=−4 mA and Is=−8 mA. n drive currents applied are I1, I2, . . . , In, where In∈(Ic, Is). The n drive currents are read with the same read current Ir. The Hall voltage output by the SOT-type spin Hall device must be the Hall voltage corresponding to the max drive current in the foregoing n drive currents, because the drive current induces the magnetic domain switching of the cobalt ferroboron layer. More magnetic domains in the cobalt ferroboron layer are switched if and only if the subsequent drive current is greater than the previous drive current, thereby changing the output Hall voltage.

For example, when the drive current is within the range of −4 mA to −8 mA, as shown in the right figure above, the following steps are performed.

In the first step, a pulsed drive current of −5.5 mA is applied, and a read current of 1 mA is then applied. At this moment, a Hall voltage V1 is obtained.

In the second step, a pulsed drive current of −6 mA is applied, and a read current of 1 mA is then applied. At this moment, a Hall voltage V2 is obtained.

In the third step, a pulsed drive current of −6.5 mA is applied, and a read current of 1 mA is then applied. At this moment, a Hall voltage V3 is obtained.

In the fourth step, a pulsed drive current of −5.5 mA is applied, and a read current of 1 mA is then applied. At this moment, a Hall voltage V4 is obtained.

It can be seen that V4=V3>V2>V1, and no erase operation is required prior to each of the foregoing steps.

It can be seen from the output characteristics of the spin Hall device of the present application that the Hall voltage thereof has non-volatility, a single correspondence, and a continuous change (analog characteristics) within an interval of Ic to Is. Therefore, a spin Hall device may be used to process a max pooling operation with a high-precision (high-digit) number, thus greatly saving on-chip resources.

According to the method for max pooling of multiple input data in the third embodiment, max pooling of multiple input data is realized by the spin Hall device in the first embodiment. That is, the max pooling function can be realized by a single device, thereby saving on-chip resources and achieving high computation accuracy.

A fourth embodiment of the present application provides a device for max pooling of multiple input data. The device includes a digital-to-analog converter and the spin Hall device in any of the foregoing implementations.

The digital-to-analog converter is configured to convert the input data into a drive current.

The spin Hall device is configured to execute the method for obtaining a Hall voltage in any of the foregoing implementations. The Hall voltage corresponding to the max drive current corresponds to max data among the foregoing plurality of input data, and the max data is the result of max pooling.

The device for max pooling of multiple input data in the fourth embodiment adopts the spin Hall device in the first embodiment. A max pooling function can be realized by a single device, thereby saving on-chip resources to a great extent, achieving high computation accuracy, and overcoming the defects of the prior art in which a max pooling circuit has a complicated circuit structure and occupies many on-chip resources.

Figure 4:
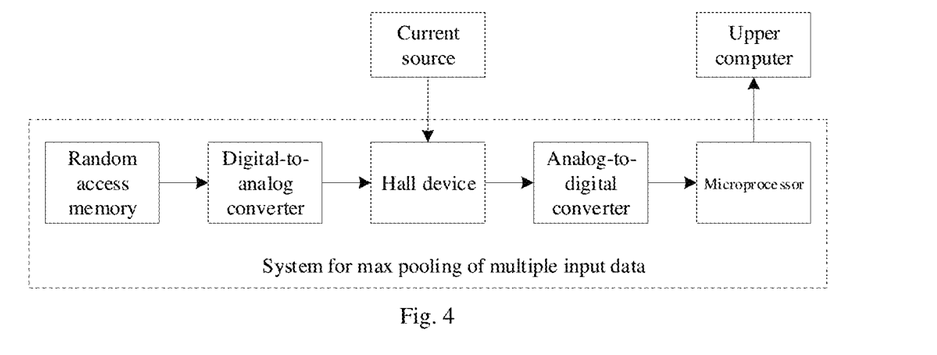
FIG. 4 shows a structural block diagram of a system for max pooling of multiple input data according to another embodiment.

With reference to FIG. 4, a fifth embodiment of the present application provides a system for max pooling of multiple input data. The system includes the spin Hall device in any of the foregoing implementations, a microprocessor, and a random access memory, a digital-to-analog converter and an analog-to-digital converter respectively connected to the microprocessor. The random access memory, the digital-to-analog converter, the spin Hall device, the analog-to-digital converter, and the microprocessor are connected in sequence.

The microprocessor is configured to control the digital-to-analog converter and the analog-to-digital converter.

The digital-to-analog converter is configured to convert the input data into an analog current.

The spin Hall device is configured to receive the analog current, and obtain a Hall voltage corresponding to a max current in the analog current.

The analog-to-digital converter is configured to convert the Hall voltage corresponding to the max current into a digital quantity.

The microprocessor is further configured to receive the foregoing digital quantity.

In some implementations, the obtaining a Hall voltage corresponding to a max current in the analog current is implemented by the method for max pooling of multiple input data in any of the foregoing implementations. The analog current is used as the drive current.

In some implementations, the system further includes an operational amplifier and a filter. The spin Hall device, the operational amplifier, the filter, and the analog-to-digital converter are connected in sequence.

The spin Hall device is configured to receive the analog current, and obtain a Hall voltage corresponding to a max current in the analog current.

The operational amplifier is configured to amplify the Hall voltage corresponding to the max current to obtain an amplified Hall voltage.

The filter is configured to filter the amplified Hall voltage to obtain a filtered Hall voltage.

The analog-to-digital converter is configured to convert the filtered Hall voltage into a digital quantity.

In some implementations, the system further includes a random access memory respectively connected to the microprocessor and the digital-to-analog converter.

The microprocessor is further configured to control the random access memory.

The random access memory is configured to receive and store the input data.

Figure 5:
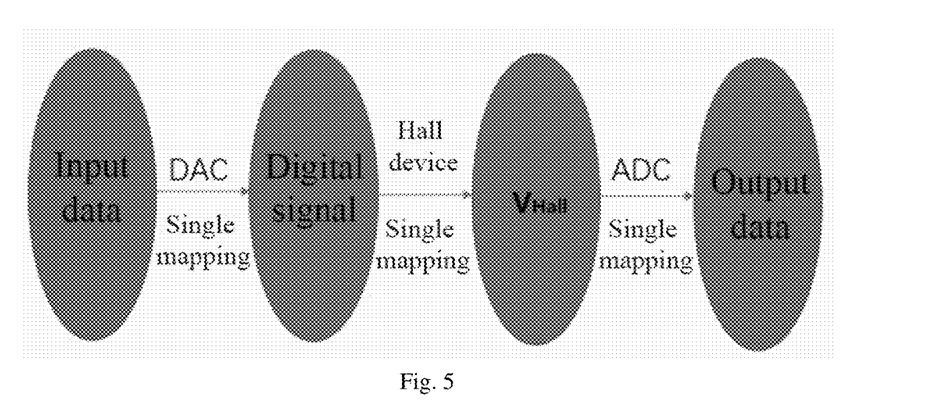
FIG. 5 shows a single mapping relationship of the system shown in FIG. 4.

With reference to a block diagram of a system for max pooling of multiple input data shown in FIG. 4, max pooling of numbers is implemented. Core modules of the system include a random access memory (RAM), a digital-to-analog converter (DAC), a SOT-type spin Hall device in any of the foregoing implementations, an analog-to-digital converter (ADC), and a microprocessor. The microprocessor may adopt, for example, a single chip MCU or ARM chip, and MCU is adopted in the present embodiment. The overall system has a single mapping relationship as shown in FIG. 5.

The operating process of the system for max pooling of multiple input data is as follows.

Firstly, under the control of the MCU, a plurality of numbers needing to be subjected to max pooling, such as 00, 01, 10, and 11, are stored in the RAM.

Secondly, under the control of the MCU, the DAC is used to sequentially convert these numbers into an analog current in a certain order, and the analog current is input as a drive current into the spin Hall device. The current converted by the DAC needs to be between Ic and Is of the spin Hall device. This step of operation is equivalent to establishing a mapping relationship between the digital quantity and the drive current.

Then, through another constant current source (or DAC), a current with a fixed intensity is provided to read the Hall voltage after the action of each drive current.

Then, the ADC is used to convert the Hall voltage into a digital quantity (the Hall voltage needs to be amplified and filtered previously). The digital quantity needs to correspond to the digital quantity input in the RAM on a one-to-one basis.

Finally, the digital quantity is controlled by the MCU, stored in an upper computer or register, and displayed. Due to the nature of the spin Hall device, after all the numbers in the RAM are sequentially processed as described above, the last displayed number must be the largest one in the RAM.

Since the SOT-type spin Hall device has both analog polymorphic characteristics and non-volatility, the device is more suitable for application in an analog computation neural network acceleration system based on a 1T1R crossbar array. A sixth embodiment of the present application proposes an analog computation neural network acceleration system. The system includes a 1T1R crossbar array, a spin Hall device, an analog-to-digital converter, and a microprocessor. The spin Hall device is the spin Hall device in any of the foregoing implementations.

The 1T1R crossbar array is configured to multiply and accumulate convolution computations by Kirchhoff's law under the control of the microprocessor to obtain multiply-accumulate data.

The spin Hall device is configured to process the multiply-accumulate data to obtain a Hall voltage. The specific processing method may adopt the method for obtaining a Hall voltage in any of the foregoing implementations.

The analog-to-digital converter is configured to convert the foregoing Hall voltage into a digital signal under the control of the microprocessor.

The microprocessor is configured to receive the digital signal.

With the foregoing analog computation neural network acceleration system, an analog computation neural network acceleration method may be implemented. The analog computation neural network acceleration method includes the following steps.

The 1T1R crossbar array multiply-accumulate convolution computations by Kirchhoff's law under the control of the microprocessor to obtain multiply-accumulate data.

The spin Hall device processes the multiply-accumulate data to obtain a Hall voltage.

The analog-to-digital converter converts the Hall voltage into a digital signal under the control of the microprocessor.

The microprocessor receives the digital signal.

In some implementations, the analog computation neural network acceleration system further includes a power amplifier, an operational amplifier, a filter, and a low dropout linear regulator. The 1T1R crossbar array, the power amplifier, the spin Hall device, the operational amplifier, the filter, the analog-to-digital converter, and the microprocessor are connected in sequence.

The power amplifier amplifies an electrical signal of the multiply-accumulate data to obtain an amplified electrical signal.

The spin Hall device is configured to process the amplified electrical signal to obtain a Hall voltage.

The operational amplifier is configured to amplify the Hall voltage to obtain an amplified Hall voltage.

The filter is configured to filter the amplified Hall voltage to obtain a filtered Hall voltage.

The analog-to-digital converter is configured to convert the filtered Hall voltage into a digital signal under the control of the microprocessor.

With the foregoing analog computation neural network acceleration system, an analog computation neural network acceleration method may be implemented. The analog computation neural network acceleration method includes the following steps.

The 1T1R crossbar array multiply-accumulate convolution computations by Kirchhoff's law under the control of the microprocessor to obtain multiply-accumulate data.

The power amplifier amplifies an electrical signal of the multiply-accumulate data to obtain an amplified electrical signal.

The spin Hall device is configured to process the amplified electrical signal to obtain a Hall voltage.

The operational amplifier is configured to amplify the Hall voltage to obtain an amplified Hall voltage.

The filter is configured to filter the amplified Hall voltage to obtain a filtered Hall voltage.

The analog-to-digital converter converts the filtered Hall voltage into a digital signal under the control of the microprocessor.

The microprocessor receives the digital signal.

Figure 6:
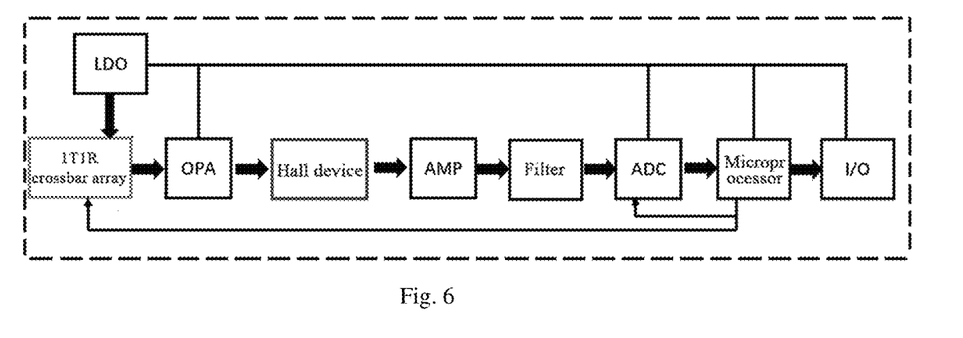
FIG. 6 shows a structural block diagram of an analog computation neural network acceleration system according to another embodiment.

Referring to the example shown in FIG. 6, the analog computation neural network acceleration system includes a 1T1R crossbar array, a power amplifier (OPA), a spin Hall device, an operational amplifier (AMP), a filter, an analog-to-digital converter (ADC), a microprocessor, and a LDO, which are connected in sequence. The full name of LDO is a low dropout regulator. The power amplifier is connected to the LDO, and the 1T1R crossbar array is connected to the analog-to-digital converter and the microprocessor, respectively. The power amplifier, the analog-to-digital converter and the LDO are connected to the microprocessor, respectively. In some implementations, the analog computation neural network acceleration system further includes an input/output (I/O) module. The I/O module is connected to the microprocessor and the LDO, respectively. The microprocessor is configured to control the operation of the 1T1R crossbar array, the power amplifier (OPA), the analog-to-digital converter (ADC), and the LDO. The microprocessor may adopt a MCU. The 1T1R crossbar array is configured to multiply and accumulate convolution computations by Kirchhoff's law.

The operating principle of the analog computation neural network acceleration system based on the 1T1R crossbar array is as follows.

With reference to FIG. 6, firstly, a 1T1R (which may be composed of elements such as RRAM, PCRAM, FeFET, and STT-MRAM) crossbar array realizes a multiply-accumulate (MAC) function of convolution computations by Kirchhoff's law. After passing through the power amplifier (amplified between Ic and Is), an output current of the array is directly charged into a SOT-type spin Hall device for processing to obtain a Hall voltage. The Hall voltage output by the SOT-type spin Hall device has non-volatility and analog polymorphism. After amplification by the operational amplifier and filtering by the filter, a fully analog MAC+Max pooling operation is completed. The filtered signal is converted into a digital quantity by the ADC, and then processed by the MCU, i.e. the digital conversion function of the system is completed.

For all data for one channel, the MAC operation of the 1T1R array is in a serial mode, just matching a max pooling mode serially implemented by the SOT-type spin Hall device.

Therefore, a SOT-type Hall element is introduced into an analog DNN hardware architecture, and the max pooling function after convolution can be completed without data exchange and transportation, thereby greatly saving on-chip resources and improving the system accuracy. The analog computation neural network acceleration system of the present embodiment optimizes the hardware architecture, improves the energy efficiency and computing power of an artificial intelligence chip, saves on-chip resources, and can also realize on-chip reasoning functions.

It should be noted as follows.

It will be understood that, although the various steps in the flowchart of the figure are shown in sequence as indicated by the arrows, these steps are not necessarily performed in the order indicated by the arrows. These steps are performed in no strict order unless explicitly stated herein, and may be performed in other orders. Moreover, at least some of the steps in the flowchart of the figure may include multiple sub-steps or stages that are not necessarily performed at the same time, but may be performed at different times. The sub-steps or stages are not necessarily performed in sequence, but may be performed in turn or in alternation with other steps or at least some of the sub-steps or stages of other steps.

The above-described embodiments express only implementations of the present application, which are described in greater detail but are not to be construed as limiting the scope of the present application. It will be appreciated by those of ordinary skill in the art that numerous variations and modifications may be made without departing from the concept of the present application, which fall within the protection scope of the present application. Therefore, the protection scope of the present application should be determined by the appended claims.

The invention claimed is:

1. A method for obtaining a Hall voltage, implemented by a spin Hall device, the spin Hall device comprising a cobalt ferroboron layer, wherein a top view and a bottom view of the spin Hall device are completely the same as a cross-shaped graph that has two axes of symmetry perpendicular to each other and equally divided by each other, the two axes of symmetry being a first axis of symmetry and a second axis of symmetry, the method comprising:

applying at least one drive current to one end of the first axis of symmetry, wherein the drive current is greater than an initial drive current and less than a saturated drive current, the initial drive current is a current when the Hall voltage of the spin Hall device starts to change, and the saturated drive current is a current when the Hall voltage of the spin Hall device is saturated; and reading the at least one drive current with the same read current, and obtaining a Hall voltage across the second axis of symmetry until all the drive currents are read out to obtain a Hall voltage corresponding to a max drive current in the at least one drive current.

2. A method for max pooling of multiple input data, comprising:
converting the input data into a drive current; and
executing the method for obtaining a Hall voltage according to claim 1, wherein the Hall voltage corresponding to the max drive current corresponds to max data among the multiple input data, and the max data is the result of max pooling.

3. A device for max pooling of multiple input data, comprising: a digital-to-analog converter and a spin Hall device, wherein
the digital-to-analog converter is configured to convert the input data into a drive current; and
the spin Hall device is configured to execute the method for obtaining a Hall voltage according to claim 1, wherein the Hall voltage corresponding to the max drive current corresponds to max data among the multiple input data, and the max data is the result of max pooling.

4. The method according to claim 1, wherein the spin Hall device comprising: a substrate layer, a tungsten layer, the cobalt ferroboron layer, a magnesium oxide layer, a tantalum layer, and a ruthenium layer, which are stacked from bottom to top in sequence.

5. The method according to claim 4, wherein the tungsten layer has a thickness of 2-5 nm; the cobalt ferroboron layer has a thickness of 1-1.5 nm; the magnesium oxide layer has a thickness of 1.5-2.5 nm; and the tantalum layer and the ruthenium layer have a total thickness of 1-10 nm.

6. A system for max pooling of multiple input data, comprising: a spin Hall device, a microprocessor, and a random access memory, a digital-to-analog converter and an analog-to-digital converter respectively connected to the microprocessor, wherein the random access memory, the digital-to-analog converter, the spin Hall device, the analog-to-digital converter, and the microprocessor are connected in sequence;
the microprocessor is configured to control the digital-to-analog converter and the analog-to-digital converter;
the digital-to-analog converter is configured to convert the input data into an analog current;
the spin Hall device is configured to receive the analog current, and obtain a Hall voltage corresponding to a max current in the analog current;
the analog-to-digital converter is configured to convert the Hall voltage corresponding to the max current into a digital quantity;
the microprocessor is further configured to receive the digital quantity; and
the spin Hall device comprising a cobalt ferroboron layer, wherein a top view and a bottom view of the spin Hall device are completely the same as a cross-shaped graph that has two axes of symmetry perpendicular to each other and equally divided by each other.

7. The system according to claim 6, wherein the analog current is used as the drive current.

8. The system according to claim 6, further comprising: an operational amplifier and a filter, wherein the spin Hall device, the operational amplifier, the filter, and the analog-to-digital converter are connected in sequence;

the spin Hall device is configured to receive the analog current, and obtain a Hall voltage corresponding to a max current in the analog current;

the operational amplifier is configured to amplify the Hall voltage corresponding to the max current to obtain an amplified Hall voltage;

the filter is configured to filter the amplified Hall voltage to obtain a filtered Hall voltage; and the analog-to-digital converter is configured to convert the filtered Hall voltage into a digital quantity.

9. The system according to claim 6, further comprising: a random access memory respectively connected to the microprocessor and the digital-to-analog converter, wherein the microprocessor is further configured to control the random access memory; and the random access memory is configured to receive and store the input data.

10. An analog computation neural network acceleration system, comprising a 1T1R crossbar array, a spin Hall device, an analog-to-digital converter, and a microprocessor, wherein comprising a cobalt ferroboron layer, wherein a top view and a bottom view of the spin Hall device are completely the same as a cross-shaped graph that has two axes of symmetry perpendicular to each other and equally divided by each other;

the 1T1R crossbar array is configured to multiply and accumulate convolution computations by Kirchhoff's law under the control of the microprocessor to obtain multiply-accumulate data;

the spin Hall device is configured to process the multiply-accumulate data to obtain a Hall voltage;

the analog-to-digital converter is configured to convert the Hall voltage into a digital signal under the control of the microprocessor; and the microprocessor is configured to receive the digital signal;

the analog computation neural network acceleration system further comprising: a power amplifier, an operational amplifier, a filter, and a low dropout linear regulator, wherein the 1T1R crossbar array, the power amplifier, the spin Hall device, the operational amplifier, the filter, the analog-to-digital converter, and the microprocessor are connected in sequence;

the power amplifier is configured to amplify an electrical signal of the multiply-accumulate data to obtain an amplified electrical signal;

the spin Hall device is configured to process the amplified electrical signal to obtain a Hall voltage;

the operational amplifier is configured to amplify the Hall voltage to obtain an amplified Hall voltage;

the filter is configured to filter the amplified Hall voltage to obtain a filtered Hall voltage; and the analog-to-digital converter is configured to convert the filtered Hall voltage into a digital signal under the control of the microprocessor.

11. An analog computation neural network acceleration method, implemented by the analog computation neural network acceleration system according to claim 10, the analog computation neural network acceleration method comprising:

multiplying and accumulating, by the 1T1R crossbar array, convolution computations by Kirchhoff's law under the control of the microprocessor to obtain multiply-accumulate data;

processing, by the spin Hall device, the multiply-accumulate data to obtain a Hall voltage;

converting, by the analog-to-digital converter, the Hall voltage into a digital signal under the control of the microprocessor; and receiving, by the microprocessor, the digital signal.

12. An analog computation neural network acceleration method, implemented by the analog computation neural network acceleration system according to claim 10, the analog computation neural network acceleration method comprising:

multiplying and accumulating, by the 1T1R crossbar array, convolution computations by Kirchhoff's law under the control of the microprocessor to obtain multiply-accumulate data;

amplifying, by the power amplifier, an electrical signal of the multiply-accumulate data to obtain an amplified electrical signal;

processing, by the spin Hall device, the amplified electrical signal to obtain a Hall voltage;

amplifying, by the operational amplifier, the Hall voltage to obtain an amplified Hall voltage;

filtering, by the filter, the amplified Hall voltage to obtain a filtered Hall voltage;

converting, by the analog-to-digital converter, the filtered Hall voltage into a digital signal under the control of the microprocessor; and receiving, by the microprocessor, the digital signal.

* * * * *